United States Patent [19]
Lee

[11] Patent Number: 5,565,790
[45] Date of Patent: Oct. 15, 1996

[54] ESD PROTECTION CIRCUIT WITH FIELD TRANSISTOR CLAMP AND RESISTOR IN THE GATE CIRCUIT OF A CLAMP TRIGGERING FET

[75] Inventor: Jian-Hsing Lee, Hsin-Chu, Taiwan

[73] Assignee: Taiwan Semiconductor Manufacturing Company Ltd, Hsin-Chu, Taiwan

[21] Appl. No.: 387,084

[22] Filed: Feb. 13, 1995

[51] Int. Cl.⁶ .............................. H02H 9/04; H01L 23/62
[52] U.S. Cl. .................. 326/30; 361/56; 361/91; 361/212; 257/360
[58] Field of Search .................. 361/56, 91, 111, 361/118, 212; 257/358, 359, 360; 326/9, 21, 23, 30

[56] References Cited

U.S. PATENT DOCUMENTS

| | | | |
|---|---|---|---|
| 3,746,946 | 7/1973 | Clark | 257/360 |
| 3,777,216 | 12/1973 | Armstrong | 257/360 |
| 3,819,952 | 6/1974 | Enomoto et al. | 257/360 |
| 4,423,421 | 12/1983 | Sasaki | 361/56 |
| 4,527,213 | 7/1985 | Ariizumi | 361/56 |
| 5,157,573 | 10/1992 | Lee et al. | 361/56 |
| 5,212,618 | 5/1993 | O'Neill et al. | 361/56 |
| 5,477,407 | 12/1995 | Kobayashi et al. | 361/91 |

OTHER PUBLICATIONS

Weste et al.; "Principles of CMOS VLSI Design, A Systems Perspective"; ©1985 by AT&T Bell Laboratories, Inc. and Kamran Eshraghian; pp. 58 and 59.

*Primary Examiner*—Edward P. Westin
*Assistant Examiner*—Benjamin D. Driscoll
*Attorney, Agent, or Firm*—George O. Saile; William S. Robertson

[57] ABSTRACT

An improved ESD protection circuit of the type having a field transistor connected as a clamp between ground and a pad to be protected and an FET trigger circuit that is connected between ground and a node where the protected circuits are connected. A resistor interconnects the pad and the node. The trigger FET turns on when a high ESD voltage causes avalanche breakdown and charge carriers from the trigger FET turn on the field transistor clamp. Before the field transistor clamp turns on, oxide breakdown in the gate oxide of the FET occurs. A resistor is connected between the gate electrode and ground to limit the current through the oxide during the time for the avalanche to develop and for the clamp to turn on.

10 Claims, 1 Drawing Sheet

ESD PROTECTION CIRCUIT WITH FIELD TRANSISTOR CLAMP AND RESISTOR IN THE GATE CIRCUIT OF A CLAMP TRIGGERING FET

FIELD OF THE INVENTION

This invention relates to semiconductor circuits and structures. More specifically it relates to a circuit for ESD (electrostatic discharge) protection for a pad of a semiconductor device and for an associated node where operating circuits are connected.

INTRODUCTION—ESD PROTECTION

Protection against ESD voltages is a familiar problem in the design of semiconductor devices. When an ESD voltage appears at an input/output pad of a semiconductor chip, it can damage the operating circuits that are connected to the pad. Some chips have a resistor connected in the signal path between the pad and the operating circuits, and it will be convenient to refer to the node where the resistor and the operating circuits are connected as the protected node to distinguish it from the pad, which is also protected by these circuits.

When there is no voltage at the pad or the pad voltage is in the range of normal signal voltages, the ESD protection circuits are inactive and do not influence the operating circuits of the chip. When the pad voltage is in the polarity of normal signal voltages but above the normal range, the protection circuits turn on and clamp the voltage at the pad and thereby protect the operating circuits from a damaging voltage.

When a high voltage of the opposite polarity appears at the pad, the components can be protected in various ways. For example, junctions associated with the pad or the circuits to be protected may become forward biased and clamp the pad voltage.

PRIOR ART

This invention will be explained as an improvement to a known ESD protection circuit. In this prior art circuit, a primary protection device (such as a field transistor) is located at the pad and a trigger device for the primary device is located at the protected node. The trigger device and the primary device cooperate to provide fast clamping for an ESD pulse. A resistor is connected in the circuit path between the pad and the circuits to limit the current through the trigger device after the primary protection device has turned on. This resistor helps to isolate the voltage at the protected node from an ESD voltage at the pad and it forms part of a trigger circuit as will be explained.

It will be helpful to describe a specific implementation in which the protection circuit is formed in a p-well in a p-type substrate, and both the primary device (the clamp circuit) and the trigger circuit have n-channel FETs. The clamp circuit is formed by a field transistor. A field transistor is formed by $N^+$ junction to $N^+$ junction and the intervening region of the substrate. When an ESD pulse voltage appears at the pad, it is clamped by the FET of the trigger circuit after the trigger circuit has undergone an avalanche breakdown. Avalanche breakdown produces hole-electron pairs, and the holes pass through the substrate to the clamp (the field transistor) and forward bias the source side to drive on a parasitic bipolar transistor associated with the trigger transistor. The resistor between the pad and the protected node limits the ESD current passed through the NMOS trigger device after the parasitic bipolar has turned on.

After the parasitic bipolar associated with the clamp has turned on in this prior art circuit, most of the ESD current passes through the field transistor and not through the trigger FET. The reason for the concern about the trigger transistor is that a heat source forms at the $N^+$ junction just below the gate oxide of the trigger FET and this heat source might damage the gate oxide.

SUMMARY OF THE INVENTION

A problem occurs in these circuits that may destroy the protection device. The ESD voltage appears as a rising pulse and this pulse continues to rise after it has reached a value to initiate oxide and avalanche break-down in the trigger FET but before the trigger FET has generated enough hole-electron pairs to turn on the field transistor. This voltage appears across the gate oxide, and produces an oxide breakdown current and thereby generates a high power dissipation at the gate oxide. This process can cause gate oxide thermal run away.

In the protection circuit of this invention, a resistor is located in the connection between the gate electrode of the trigger FET and ground. Normally there is no current in this circuit (and no voltage drop between the gate electrode end of the resistor and the ground end of the resistor) and the gate electrode is at ground, as in the operation of the prior art protection device. When an ESD pulse appears at the pad, the protection circuit does not turn on immediately and the ESD voltage rises at the drain diffusion of the trigger transistor.

As the ESD voltage continues to rise, the voltage between the drain and the gate electrode can reach a value at which the gate oxide undergoes dielectric breakdown. Current then flows through the oxide and the gate electrode to ground. However, the delay in the rise in the voltage across the gate-drain oxide overlaps is sufficient to allow the parasitic bipolar transistor to turn on and clamp the voltage before the voltage has reached a high enough value to damage the operating circuits.

THE DRAWING

THE PREFERRED EMBODIMENT

Figure 1:
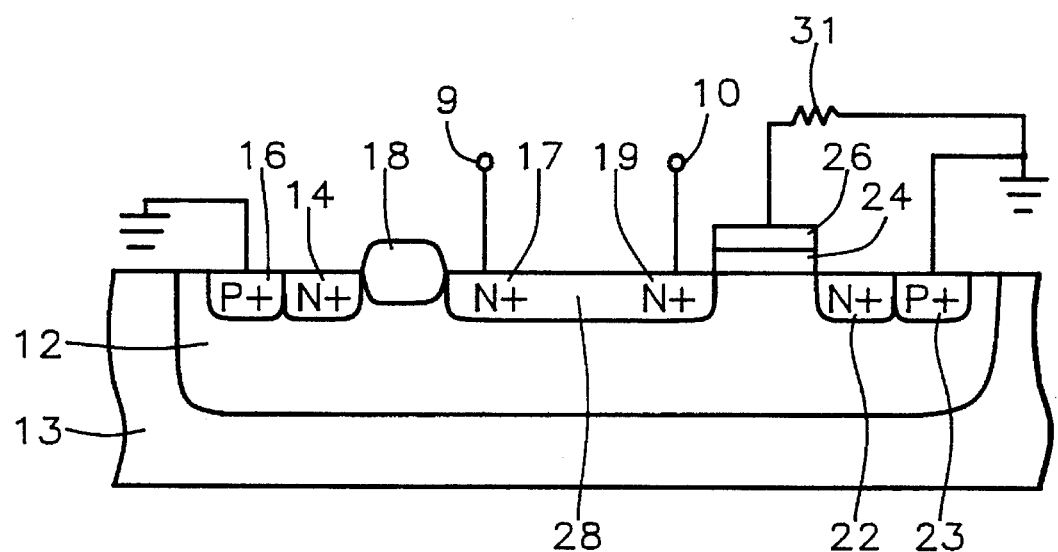
FIG. 1 is a diagram showing the semiconductor structure of one embodiment of the invention.

The Structure of the Protection Device—FIG. 1

FIG. 1 shows a pad 9 where an ESD voltage may appear and a protected node 10 where components (conventional and shown as a block 11 in FIG. 1) are connected. The pad and the protected node are interconnected, and the ESD voltage at pad 9 may damage the circuits 11 at node 10. The protective circuit is formed in an n-well 12 of a p-type substrate 13. Equivalently, the device can have a p-well in an n-type substrate. The corresponding structure for an n-type substrate or an n-well in a p-substrate will be readily apparent without specific explanation.

Figure 2:
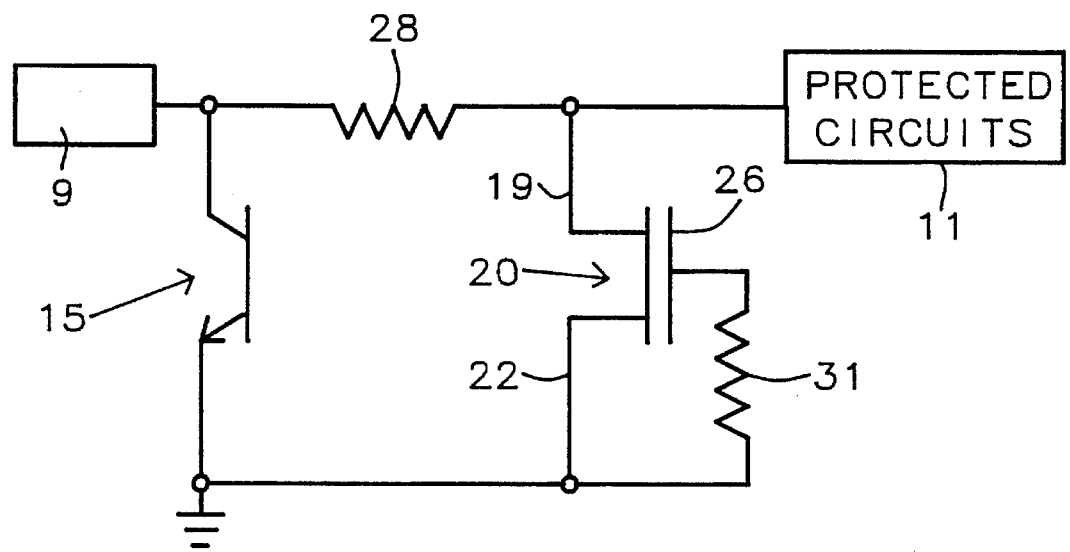
FIG. 2 is a schematic diagram of the protection circuit of this invention.

The schematic drawing of FIG. 2 has the same reference characters as FIG. 1 and it will help in the explanation of FIG. 2. It will be understood from the description of FIG. 1 without a separate explanation.

The Field Transistor Structure

An N$^+$ diffusion 14 forms the source of the field oxide transistor 15. A P$^+$ diffusion 16 is provided for a connection to ground for the source diffusion. (This junction is forward biased in the direction of source current flow.) An N$^+$ diffusion 17 forms the drain of the field transistor and it is connected to the pad 9. A gate oxide layer 18 is formed during the process step of forming field oxide on the substrate.

The Trigger Transistor Circuit Structure

An N+ diffusion 19 forms the drain of the trigger FET 20 and it is connected to the protected node 10. An N+ diffusion 22 forms the source of this FET and a P$^+$ diffusion 23 provides a connection to ground for the source diffusion. The gate oxide 24 and the gate electrode 26 are conventionally formed.

The drain diffusion 17 of the field transistor (where the pad is connected and where an ESD voltage appears initially) and the drain diffusion 19 of the triggering transistor are spaced apart and the intervening region of the n-well forms a resistor 28 which is shown schematically in FIG. 1.

The Gate-to-Ground Resistor

A resistor 31 connects the gate electrode 26 to ground. Preferably resistor 31 is formed in p-well 12 and is connected to the gate electrode and ground by conductors formed on the surface of the substrate. The preferred value for resistor 31 is about 200 ohms.

Operation

So long as the voltage at the protected node 10 remains in the range of normal signal voltages, the trigger transistor 20 and the field transistor 15 remain turned off and do not affect the operation of the circuit. The trigger FET 20 remains turned off because the drain-channel junction is reverse biased by a positive signal voltage at node 10. The field transistor 15 remains turned off because its channel does not have any charge carriers in to support conduction.

When a high positive voltage appears at pad 9, it propagates through resistor 28 to the protected node 10. As this voltage rises, it causes oxide breakdown in insulation layer 24, and this breakdown accelerates the avalanche breakdown which triggers the primary device 15 and limits the ESD voltage at pad 9 and protected node 10.

When the oxide layer 24 breaks down, resistor 31 limits the oxide-breakdown current and thereby reduces the voltage difference between drain 19 and gate 26 to prevent oxide thermal run away. As part of this process, many electron-hole pairs are created. The holes pass through the p-substrate (from trigger transistor 20 to primary device 15) and forward bias the source side 14 to turn on the parasitic bipolar transistor (collector 17, base 12, emitter 14) and the primary device 15. The bipolar transistor then goes into the snap-back region of its volt-ampere characteristic. Resistor 28 will limit the current passed through the bipolar (19-20-22) such that most ESD current passes through the primary device (18, 15, 14).

Summary

From the description of a preferred embodiment of the invention, those skilled in the art will recognize suitable variations within the spirit of the invention and the intended scope of the claims.

I claim:

1. A circuit for protecting operating circuits (11) of a semiconductor chip that are connected to a pad (9) where ESD voltages may appear, the protection circuit comprising, a field transistor (20) having its channel underlying a layer of field oxide and its drain (17) connected to the pad and its source (14) connected to ground for clamping a voltage at the pad when the field transistor is turned on, a trigger FET (20) having its source (19) connected to ground and its drain (22) coupled to receive an ESD voltage at the pad, the trigger FET being subject to avalanche breakdown at ESD voltage levels, the gate oxide (24) of the trigger FET being subject to oxide breakdown at ESD voltage levels and being subject to thermal run-away when the oxide breakdown current is high, and a first resistor (31) connecting the gate electrode (26) of the trigger FET to ground to maintain the trigger FET turned off in response to signal level voltages at the pad and to turn on the trigger FET by oxide and avalanche breakdown in response to an ESD voltage at the pad and to thereby produce hole-electron pairs, the trigger FET and the field transistor being located for charge carriers from the avalanche breakdown of the trigger FET to enter the field transistor and turn it on to clamp the ESD voltage, the first resistor having a value to prevent damage to the trigger FET in the time before the field transistor has turned on and thereby preventing damage to the operating circuits or the trigger FET.

2. The circuit of claim 1 wherein the drain (17) of the field transistor (15) and the drain (19) of the trigger FET are located to form a second resistor (28) interconnecting the pad (9) and the protected node (10).

3. The circuit of claim 2 wherein the first resistor (31) connecting the gate electrode has a sufficiently low value to keep the trigger FET turned off while normal operating voltages are on the pad.

4. The circuit of claim 1 wherein the first resistor (31) connecting the gate electrode has a sufficiently high value to limit the oxide break down current and the voltage between drain to gate to a low value during the initiation of avalanche breakdown of the drain-channel junction of the trigger FET.

5. The circuit of claim 4 wherein the circuit has a diffusion (23) of the opposite conductivity type as its source diffusion (22) of the trigger FET (20), means connecting the diffusion of opposite conductivity type to ground, said diffusion of the opposite conductivity type forming a junction with the source diffusion (22) of the trigger FET for grounding the source diffusion, and wherein the first resistor (31) connecting the gate electrode is connected to ground with the diffusion.

6. The circuit of claim 5 wherein said diffusions of the trigger FET (20) and the field transistor (15) are formed in a semiconductor structure and the first resistor (31) connecting the gate electrode is formed as a diffusion in said semiconductor structure.

7. The circuit of claim 6 wherein the first resistor (31) connecting the gate electrode is connected to the gate electrode by wiring on the surface of the semiconductor structure.

8. The circuit of claim 7 wherein the first resistor (31) connecting the gate electrode is connected to ground by wiring on the surface of the semiconductor structure.

9. The circuit of claim 8 wherein the trigger FET (20) and the field transistor (15) are formed in a well in a semiconductor structure.

10. The circuit of claim 9 wherein the resistor (31) connecting the gate electrode is formed in the well.

* * * * *